United States Patent
Cheng et al.

(10) Patent No.: US 10,747,354 B2
(45) Date of Patent: Aug. 18, 2020

(54) PIEZOELECTRIC DETECTION CIRCUIT, ARRAY, PRESSURE DETECTION DEVICE AND METHOD

(71) Applicant: BOE TECHNOLOGY GROUP CO., LTD., Beijing (CN)

(72) Inventors: Chihjen Cheng, Beijing (CN); Xueyou Cao, Beijing (CN); Pengpeng Wang, Beijing (CN); Xiaoliang Ding, Beijing (CN); Yuzhen Guo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1 day.

(21) Appl. No.: 16/184,259

(22) Filed: Nov. 8, 2018

(65) Prior Publication Data
US 2019/0204978 A1    Jul. 4, 2019

(30) Foreign Application Priority Data
Jan. 4, 2018  (CN) .......................... 2018 1 0006855

(51) Int. Cl.
*G06F 3/041* (2006.01)
*H01L 41/047* (2006.01)
*H01L 41/04* (2006.01)
*H01L 41/113* (2006.01)

(52) U.S. Cl.
CPC .......... *G06F 3/0414* (2013.01); *G06F 3/0412* (2013.01); *H01L 41/042* (2013.01); *H01L 41/047* (2013.01); *H01L 41/1132* (2013.01); *G06F 2203/04105* (2013.01)

(58) Field of Classification Search
CPC ......... G06F 2203/04105; G06F 3/0412; G06F 3/0414; H01L 41/042; H01L 41/047; H01L 41/1132
See application file for complete search history.

(56) References Cited

U.S. PATENT DOCUMENTS

| | | | |
|---|---|---|---|
| 2002/0054394 A1* | 5/2002 | Sasaki | G06K 9/0002 358/514 |
| 2002/0196036 A1* | 12/2002 | Toyoshima | G06K 9/0002 324/702 |
| 2005/0190954 A1* | 9/2005 | Shatford | G06K 9/0002 382/124 |

(Continued)

FOREIGN PATENT DOCUMENTS

CN    100343863    10/2007

*Primary Examiner* — Dmitriy Bolotin
(74) *Attorney, Agent, or Firm* — Dinsmore & Shohl LLP

(57) ABSTRACT

The present disclosure provides a piezoelectric detection circuit, an array, a pressure detection device and a method. The piezoelectric detection circuit comprises a constant current circuit, a dual-gate transistor, and a transmission circuit. The dual-gate transistor comprises a first gate, a second gate, a first electrode, and a second electrode. The first gate is configured to receive a first voltage signal. The second gate is configured to receive a bias voltage and a pressure. The first electrode is electrically connected to a first voltage terminal. The second electrode is configured to receive a constant current. The transmission circuit is configured to output a second voltage signal from the second electrode. A magnitude of the pressure is obtained according to an amplitude of the second voltage signal.

18 Claims, 8 Drawing Sheets

(56) References Cited

U.S. PATENT DOCUMENTS

2005/0213799 A1* 9/2005 Sawano ............... G06K 9/0002
             382/124
2018/0011053 A1* 1/2018 Hadwen ............. G01N 27/4145
2018/0286989 A1* 10/2018 Zhang ................ H01L 29/4908

* cited by examiner

PIEZOELECTRIC DETECTION CIRCUIT, ARRAY, PRESSURE DETECTION DEVICE AND METHOD

CROSS-REFERENCE TO RELATED APPLICATIONS

The present applications claims priority to China Patent Application No. 201810006855.3 filed on Jan. 4, 2018, the disclosure of which is incorporated by reference herein in its entirety.

TECHNICAL FIELD

The present disclosure relates to a piezoelectric detection circuit, an array, a pressure detection device and a method.

BACKGROUND

Currently, a pressure sensor may be integrated within a display so that the display implements a touch function.

SUMMARY

According to one aspect of embodiments of the present disclosure, a piezoelectric detection circuit is provided. The piezoelectric detection circuit comprises: a dual-gate transistor, wherein a first gate of the dual-gate transistor is configured to receive a first voltage signal, a second gate of the dual-gate transistor is configured to receive a bias voltage and a pressure, a first electrode of the dual-gate transistor is electrically connected to a first voltage terminal, and a second electrode of the dual-gate transistor is configured to receive a constant current; a constant current circuit configured to provide the constant current to the dual-gate transistor; and a transmission circuit configured to output a second voltage signal from the second electrode, wherein a magnitude of the pressure is obtained according to an amplitude of the second voltage signal.

In some embodiments, the transmission circuit comprises: a switch transistor, wherein a gate of the switch transistor is configured to receive a gating signal, a first electrode of the switch transistor is electrically connected to the second electrode of the dual-gate transistor, and a second electrode of the switch transistor is configured to output the second voltage signal in the case that the switch transistor turns on.

In some embodiments, an output terminal of the constant current circuit is electrically connected to the second electrode of the dual-gate transistor.

In some embodiments, an output terminal of the constant current circuit is electrically connected to the second electrode of the switch transistor.

In some embodiments, the constant current circuit comprises a second voltage terminal and a PMOS transistor, wherein a first electrode of the PMOS transistor is electrically connected to the second voltage terminal, and a second electrode of the PMOS transistor is electrically connected to the second electrode of the dual-gate transistor.

In some embodiments, the first voltage terminal is a ground terminal, and the second voltage terminal is a power supply voltage terminal.

In some embodiments, the magnitude of the pressure is obtained according to the amplitude of the second voltage signal and a corresponding relation between the pressure and the amplitude of the second voltage signal.

In some embodiments, The pressure is positively related to the amplitude of the second voltage signal.

According to another aspect of embodiments of the present disclosure, a piezoelectric detection circuit array is provided. The piezoelectric detection circuit array comprises: a plurality of piezoelectric detection circuits as described above.

In some embodiments, the transmission circuit of each of the piezoelectric detection circuits comprises a switch transistor, wherein in each of the piezoelectric detection circuits, a first electrode of the switch transistor is electrically connected to the second electrode of the dual-gate transistor; the piezoelectric detection circuit array further comprises: an input signal line electrically connected to the first gate of the dual-gate transistor in each of the plurality of piezoelectric detection circuits, and configured to provide the first voltage signal to the plurality of piezoelectric detection circuits; a plurality of gating signal lines, each of which is electrically connected to a gate of the switch transistor in each of the piezoelectric detection circuits in the same row, and is configured to provide a gating signal to the piezoelectric detection circuits in the same row; and a plurality of output signal lines, each of which is electrically connected to a second electrode of the switch transistor in each of the piezoelectric detection circuits in the same column, and is configured to output the second voltage signal from the switch transistor of a gated piezoelectric detection circuit.

According to another aspect of embodiments of the present disclosure, a piezoelectric detection circuit array is provided. The piezoelectric detection circuit array comprises: a plurality of piezoelectric detection circuits, each of which comprises a dual-gate transistor and a switch transistor, wherein a second gate of the dual-gate transistor is configured to receive a bias voltage and a pressure, a first electrode of the dual-gate transistor is electrically connected to a first voltage terminal, and a second electrode of the dual-gate transistor is electrically connected to a first electrode of the switch transistor; an input signal line, electrically connected to a first gate of the dual-gate transistor in each of the plurality of piezoelectric detection circuits and configured to provide a first voltage signal to the plurality of piezoelectric detection circuits; a plurality of gating signal lines, each of which is electrically connected to a gate of the switch transistor in each of the piezoelectric detection circuits in the same row, and is configured to provide a gating signal to the piezoelectric detection circuits in the same row; a plurality of output signal lines, each of which is electrically connected to a second electrode of the switch transistor in each of the piezoelectric detection circuits in the same column, and is configured to output a second voltage signal from the switch transistor of a gated piezoelectric detection circuit; and a plurality of constant current circuits, each of which is configured to provide a constant current to the same column of piezoelectric detection circuits via the output signal line connected thereto; wherein a magnitude of the pressure is obtained by detecting an amplitude of the second voltage signal.

According to another aspect of embodiments of the present disclosure, a pressure detection device is provided. The pressure detection device comprises: a piezoelectric detection circuit as described above.

According to another aspect of embodiments of the present disclosure, a pressure detection device is provided. The pressure detection device comprises: a piezoelectric detection circuit array as described above.

According to another aspect of embodiments of the present disclosure, a method of detecting a pressure by a piezoelectric detection circuit is provided. The method comprises: providing a constant current to a second electrode of a dual-gate transistor of a piezoelectric detection circuit by a constant current circuit of the piezoelectric detection circuit, wherein a first electrode of the dual-gate transistor is electrically connected to a first voltage terminal; inputting a first voltage signal to a first gate of the dual-gate transistor, and inputting a bias voltage and providing a pressure to a second gate of the dual-gate transistor; receiving a second voltage signal from a transmission circuit of the piezoelectric detection circuit, wherein the second voltage signal comes from the second electrode; and obtaining a magnitude of the pressure according to an amplitude of the second voltage signal.

In some embodiments, the step of obtaining a magnitude of the pressure according to an amplitude of the second voltage signal comprises: obtaining the magnitude of the pressure according to the amplitude of the second voltage signal and a corresponding relation between the pressure and the amplitude of the second voltage signal.

According to another aspect of embodiments of the present disclosure, a method of detecting a pressure by the piezoelectric detection circuit array described above is provided. The piezoelectric detection circuit array comprises n×m piezoelectric detection circuits, in which n and m are both positive integers, the method comprising: providing a constant current to a corresponding dual-gate transistor by a constant current circuit in the piezoelectric detection circuit in an $i_{th}$ row and $j_{th}$ column, wherein 1≤i≤n, 1≤j≤m, and i and j are both positive integers; inputting a first voltage signal to a first gate of the dual-gate transistor of the piezoelectric detection circuit in the $i_{th}$ row and $j_{th}$ column, and inputting a bias voltage and providing a pressure to a second gate of the dual-gate transistor of the piezoelectric detection circuit in the $i_{th}$ row and $j_{th}$ column; providing a gating signal to piezoelectric detection circuits in the $i_{th}$ row by a gating signal line for the $i_{th}$ row so that a switch transistor of each of the piezoelectric detection circuits in the $i_{th}$ row turns on, and outputting a second voltage signal by an output signal line for the $j_{th}$ column; and obtaining a magnitude of the pressure according to an amplitude of the second voltage signal.

In some embodiments, the step of obtaining a magnitude of the pressure according to an amplitude of the second voltage signal comprises: obtaining the magnitude of the pressure according to the amplitude of the second voltage signal and a corresponding relation between the pressure and the amplitude of the second voltage signal.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1:
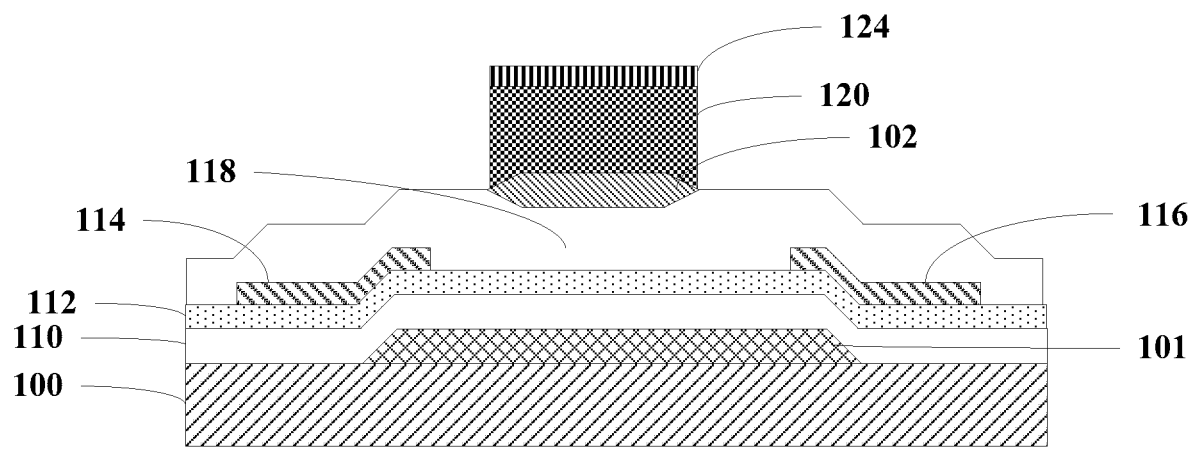
FIG. 1 is a cross-sectional view showing the structure of a dual-gate transistor according to some embodiments.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "contain" or variants thereof means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to the other devices without an intermediate device, and alternatively, may not be directly connected to the other devices but with an intermediate device.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

In the related art, a further gate is placed on a gate of a TFT (Thin Film Transistor) and a pressure material is deposited to form a dual-gate transistor. The dual-gate transistor may be used as a pressure sensor.

FIG. 1 is a cross-sectional view showing the structure of a dual-gate transistor according to some embodiments. As shown in FIG. 1, the dual-gate transistor comprises: a substrate (e.g., a glass substrate) 100, a first gate 101 on the substrate 100, a gate insulator layer (e.g., silicon dioxide) 110 covering the first gate 101, an IGZO (indium gallium zinc oxide) layer 112 on the gate insulator layer 110, a source 114 and a drain 116 on the IGZO layer 112, a passivation layer 118 covering the source 114 and the drain 116, a second gate (or referred to as a top gate) 102 on the passivation layer 118, a pressure material (e.g., P (VDF-TrFE)) layer 120 on the second gate 102 and a top metal layer 124 on the pressure material layer 120.

In the related art, a dual-gate transistor may be used to make up a detection circuit. A pressure is applied to the top metal layer 124 of the dual-gate transistor. The magnitude of the pressure is determined by detecting an output current of the circuit.

Figure 2A:
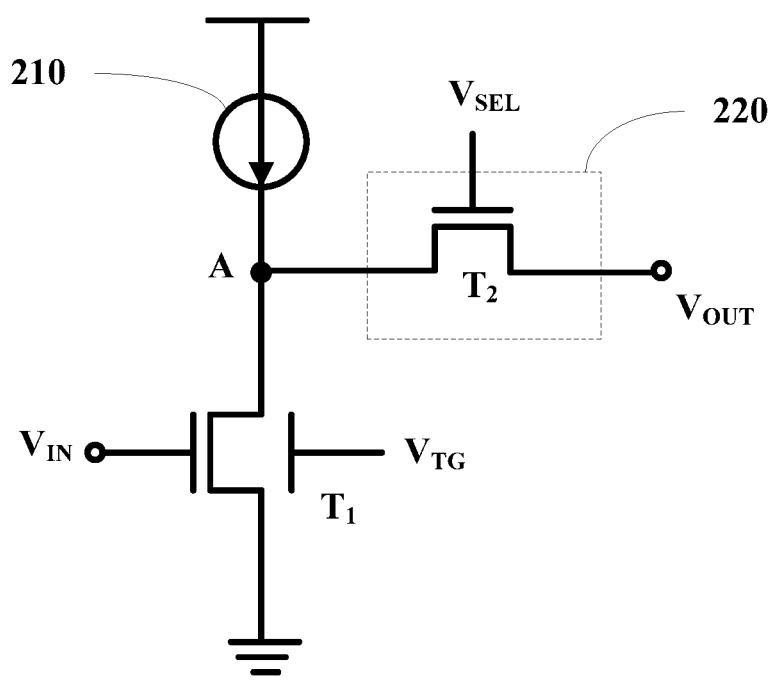
FIG. 2A is a circuit connection diagram showing a piezoelectric detection circuit according to some embodiments of the present disclosure.

FIG. 2A is a circuit connection diagram showing a piezoelectric detection circuit according to some embodiments of the present disclosure. As shown in FIG. 2A, the piezoelectric detection circuit comprises a constant current circuit 210, a dual-gate transistor $T_1$, and a transmission circuit 220.

The first gate of the dual-gate transistor $T_1$ is configured to receive a first voltage signal $V_{IN}$. The second gate of the dual-gate transistor $T_1$ is configured to receive a bias voltage $V_{TG}$ and a pressure. A first electrode of the dual-gate transistor $T_1$ is electrically connected to a first voltage terminal (for example, the first voltage terminal is a ground terminal). A second electrode of the dual-gate transistor $T_1$ is configured to receive a constant current.

The constant current circuit 210 is configured to provide the constant current to the dual-gate transistor $T_1$. For example, the constant current circuit is a constant current source.

The transmission circuit 220 is configured to output a second voltage signal (i.e., a second voltage signal at the point A) $V_{OUT}$ from the second electrode of the dual-gate transistor $T_1$. A magnitude of the pressure (i.e., the pressure received by the second gate of the dual-gate transistor $T_1$) is obtained according to an amplitude of the second voltage signal $V_{OUT}$.

In the piezoelectric detection circuit of the above-described embodiment, the constant current circuit provides a constant current to the dual-gate transistor. The first gate of the dual-gate transistor receives the first voltage signal. The second gate of the dual-gate transistor receives the bias voltage and the pressure. The transmission circuit electrically connected to the dual-gate transistor outputs the second voltage signal from the second electrode of the dual-gate transistor. The magnitude of the pressure is obtained according to the amplitude of the second voltage signal. The detection of the magnitude of the pressure applied to the second gate of the dual-gate transistor is achieved through the above-described piezoelectric detection circuit according to some embodiments of the present disclosure. The structure of the piezoelectric detection circuit according to some embodiments of the present disclosure is simple and the implementation thereof is easy. Further, compared with the solution in which the magnitude of the pressure is determined by detecting an output current of the circuit in the related art, in the circuit according to some embodiments of the present disclosure the magnitude of the pressure is obtained according to the amplitude of the output voltage signal (i.e., the second voltage signal), therefore the circuit according to some embodiments of the present disclosure achieves a better anti-noise performance.

In some embodiments, as shown in FIG. 2A, the transmission circuit 220 comprises a switch transistor $T_2$. The gate of the switch transistor $T_2$ is configured to receive a gating signal $V_{SEL}$. The first electrode of the switch transistor $T_2$ is electrically connected to the second electrode of the dual-gate transistor $T_1$. For example, the first electrode of the switch transistor $T_2$ is electrically connected to the second electrode of the dual-gate transistor $T_1$ at the point A. A second electrode of the switch transistor $T_2$ is configured to output the second voltage signal $V_{OUT}$ in the case that the switch transistor turns on. For example, the second electrode of the dual-gate transistor $T_1$ outputs the second voltage signal, and the second voltage signal is output via the switch transistor $T_2$ turned on.

It should be noted that the transmission circuit according to some embodiments of the present disclosure may be a circuit with other circuit structures, and is not only limited to the switch transistor here.

In some embodiments, as shown in FIG. 2A, the output terminal of the constant current circuit 210 is electrically connected to the second electrode of the dual-gate transistor $T_1$.

In some embodiments, the dual-gate transistor is an N-channel dual-gate transistor. In this case, the first gate and the second gate of the dual-gate transistor $T_1$ are respectively the first gate 101 and the second gate 102 of the dual-gate transistor shown in FIG. 1. The first electrode and the second electrode of the dual-gate transistor are respectively the source 114 and the drain 116 of the dual-gate transistor shown in FIG. 1.

In other embodiments, the dual-gate transistor is a P-channel dual-gate transistor. In this case, the first gate and the second gate of the dual-gate transistor $T_1$ are respectively the first gate 101 and the second gate 102 of the dual-gate transistor shown in FIG. 1. The first electrode and the second electrode of the dual-gate transistor are respectively the drain 116 and the source 114 of the dual-gate transistor shown in FIG. 1.

Figure 2B:
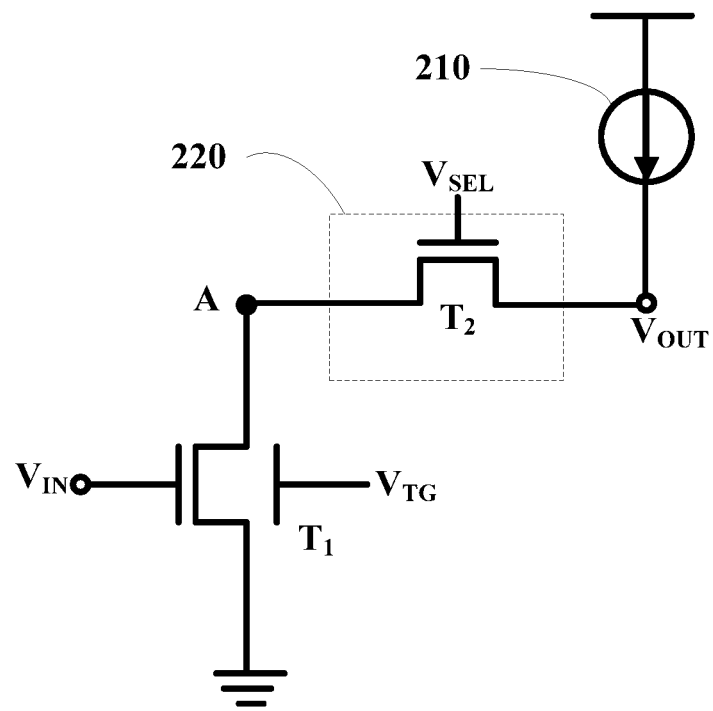
FIG. 2B is a circuit connection diagram showing a piezoelectric detection circuit according to other embodiments of the present disclosure.

FIG. 2B is a circuit connection diagram showing a piezoelectric detection circuit according to other embodiments of the present disclosure. Compared with the piezoelectric detection circuit shown in FIG. 2A, the piezoelectric detection circuit shown in FIG. 2B is different in that: the output terminal of the constant current circuit 210 is electrically connected to the second electrode of the switch transistor $T_2$. Thus, the output terminal of the constant current circuit 210 is indirectly electrically connected to the second electrode of the dual-gate transistor $T_1$ via the switch transistor $T_2$. For example, the second electrode of the dual-gate transistor $T_1$ is electrically connected to the first electrode of the switch transistor $T_2$ at the point A, and the output terminal of the constant current circuit 210 is electrically connected to the second electrode of the switch transistor $T_2$, thus the constant current circuit provides the constant current to the dual-gate transistor in the case that the switch transistor turns on.

Figure 3:
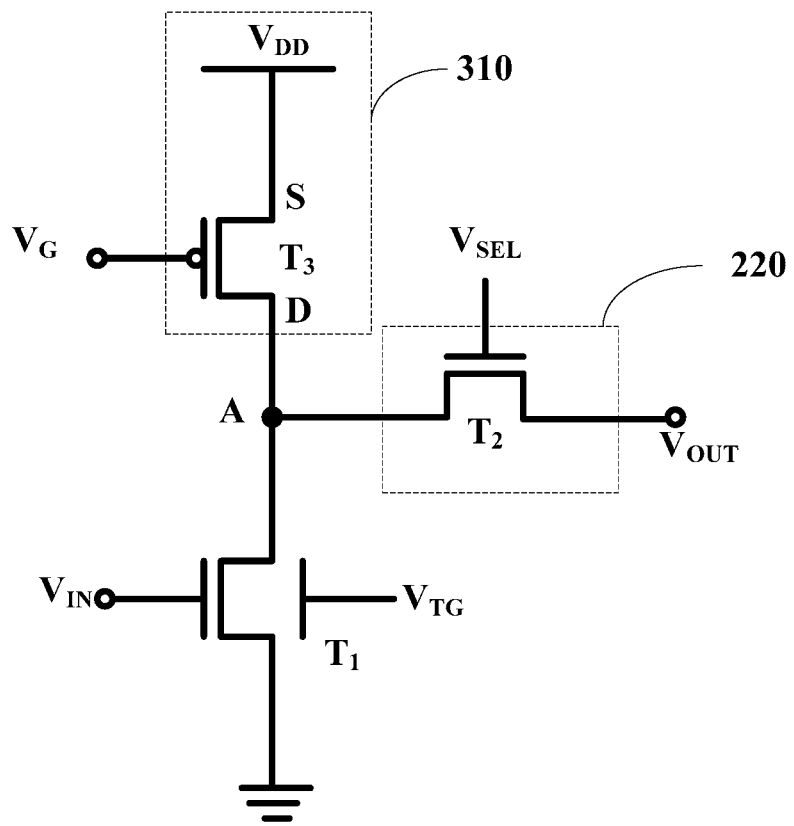
FIG. 3 is a circuit connection diagram showing a piezoelectric detection circuit according to other embodiments of the present disclosure.

FIG. 3 is a circuit connection diagram showing a piezoelectric detection circuit according to other embodiments of the present disclosure. The dual-gate transistor $T_1$ and the switch transistor $T_2$ in FIG. 3 are respectively the same as or similar to the dual-gate transistor $T_1$ and the switch transistor $T_2$ in FIG. 2A, so the specific and repeated description is omitted. The constant current circuit 310 shown in FIG. 3 is a specific implementation of the constant current circuit 210 shown in FIG. 2A.

In some embodiments, as shown in FIG. 3, the constant current circuit 310 comprises a second voltage terminal and a PMOS transistor $T_3$. For example, the second voltage terminal is a power supply voltage terminal $V_{DD}$. The first electrode (e.g., the source S) of the PMOS transistor $T_3$ is electrically connected to the second voltage terminal. The second electrode (e.g., the drain D, which may serve as an output terminal) of the PMOS transistor $T_3$ is electrically connected to the second electrode of the dual-gate transistor $T_1$. For another example, the second electrode of the PMOS transistor is electrically connected to the second electrode of the switch transistor $T_2$ such that the second electrode of the PMOS transistor is indirectly electrically connected to the second electrode of the dual-gate transistor $T_1$ via the switch transistor $T_2$.

The PMOS transistor $T_3$, when turns on, outputs the constant current to the second electrode of the dual-gate transistor. For example, a gate voltage $V_G$ is applied to the gate of the PMOS transistor such that the PMOS transistor turns on, thereby outputting the constant current to the dual-gate transistor. For example, the magnitude of the constant current is determined by the current-voltage characteristics of the PMOS transistor $T_3$. The constant current circuit which has a simple structure, is easy to implement with a low cost.

In some embodiments, the PMOS transistor is replaced with an NMOS transistor. That is, the constant current circuit comprises the second voltage terminal and the NMOS transistor.

In some embodiments, in the case that the dual-gate transistor is an N-channel dual-gate transistor, the first voltage signal is, for example, a sine wave signal. It is very convenient to perform detection by using a sine wave signal as the first voltage signal. As shown in FIG. 3, the second gate of the dual-gate transistor $T_1$ receives a bias voltage $VT_G$. The bias voltage $V_{TG}$ is used to stabilize the operation of the dual-gate transistor. Since the sine wave signal (as the first voltage signal) $V_{IN}$ is input to the first gate of the dual-gate transistor $T_1$, an output signal reverse to the input sine wave signal (that is, the waveform of the output signal is opposite to that of the input signal) is obtained at the point A. The gain relationship between the output signal and the sine wave signal $V_{IN}$ is $$V_A = V_{IN} \times g_m \times r_O, \quad (1)$$

wherein, the transconductance $g_m$ is $$g_m = \mu C_{OX}(W/L)(V_{IN} - V_{TH}) \quad (2)$$

wherein, $V_A$ is the voltage signal output from the point A, $\mu$ is the effective carrier mobility, $C_{OX}$ is the capacitance of the dual-gate transistor, W/L is the width to length ratio of the dual-gate transistor, all of $\mu$, $C_{OX}$ and W/L are known parameters, and $V_{TH}$ is the threshold voltage of the dual-gate transistor. In addition, $r_O$ is a parallel impedance of the output impedance of the dual-gate transistor $T_1$ and the output impedance of the PMOS transistor $T_3$.

When the second gate of the dual-gate transistor is subjected to a pressure, the threshold voltage $V_{TH}$ of the dual-gate transistor changes with the pressure. As can be known from the above-described formula (2), $g_m$ is linearly related to $V_{TH}$. Thus, $g_m$ also changes with the pressure, so that the gain $V_A$ changes with the pressure. Therefore, when the pressure changes, the amplitude of the output signal at the point A also changes with the pressure. The output signal at the point A is output through the switch transistor, that is, the output second voltage signal is obtained at the second electrode of the switch transistor. Here, the second voltage signal $V_{OUT} = V_A$. The magnitude of the pressure is obtained by detecting the amplitude of the second voltage signal $V_{OUT}$.

Moreover, since the pressure to which the second gate of the dual-gate transistor is subjected is inversely related to the threshold voltage $V_{TH}$, and $g_m$ is also inversely related to the threshold voltage $V_{TH}$, the corresponding relation between the pressure and the amplitude of the output second voltage signal is a corresponding relation of positive correlation, that is, the pressure is positively related to the amplitude of the second voltage signal.

In some embodiments, in the case that the dual-gate transistor is a P-channel dual-gate transistor, the first voltage signal is a constant voltage signal. It is very convenient to perform detection by using a constant voltage signal as the first voltage signal. For example, the second gate of the dual-gate transistor receives a bias voltage $V_{TG}$. The bias voltage $V_{TG}$ is used to stabilize the operation of the dual-gate transistor. When the constant voltage signal (as the first voltage signal) $V_{IN}$ is input to the first gate of the dual-gate transistor, in the dual-gate transistor, the current-voltage expression is presented as below:

$$I = K(V_{IN} - V_A - V_{TH})^2, \quad (3)$$

wherein, K is a known parameter, the current I is a constant current provided by the constant current circuit, and $V_A$ is a voltage signal output at the point A. The voltage signal $V_A$ is in the same direction as the input voltage signal $V_{IN}$. As $V_{IN}$ is a constant voltage signal, the output signal $V_A$ at the point A is linearly related to $V_{TH}$. Since the threshold voltage $V_{TH}$ of the dual-gate transistor changes with the pressure, the output signal $V_A$ at the point A changes with the pressure, and the amplitude of the output signal at the point A also changes with the pressure. The magnitude of the pressure is obtained by detecting the amplitude of the output signal (i.e., the second voltage signal) $V_{OUT}$ at the point A.

It can be seen from the above formula (3) that, the output signal $V_A$ at the point A is inversely related to $V_{TH}$, and the pressure to which the second gate of the dual-gate transistor is subjected is also inversely related to the threshold voltage $V_{TH}$, so the pressure is positively related to the amplitude of the second voltage signal.

In some embodiments, the magnitude of the pressure is obtained according to an amplitude of the second voltage signal and a corresponding relation between the pressure and the amplitude of the second voltage signal. For example, the corresponding relation between the pressure and the amplitude of the second voltage signal is obtained according to the formulas (1), (2) as well as the known corresponding relation between the pressure and the threshold voltage, so as to the magnitude of the pressure is obtained according to an amplitude of the second voltage signal and a corresponding relation between the pressure and the amplitude of the second voltage signal.

In other embodiments, a corresponding relation list between the pressure and the amplitude of the second voltage signal is obtained in advance, and then the magnitude of the corresponding pressure is obtained by retrieving the corresponding relation list based on the amplitude of the output second voltage signal.

Figure 4:
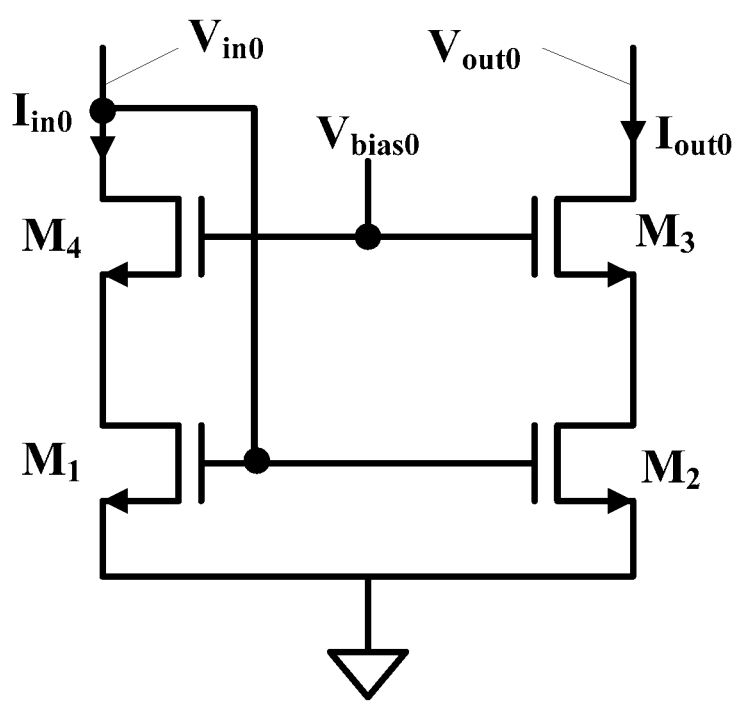
FIG. 4 is a circuit connection diagram showing a constant current circuit according to some embodiments of the present disclosure.

FIG. 4 is a circuit connection diagram showing a constant current circuit according to some embodiments of the present disclosure. As shown in FIG. 4, the constant current circuit is a constant current circuit with a cascode architecture (for example, a cascode current mirror).

As shown in FIG. 4, the constant current circuit comprises a first transistor $M_1$, a second transistor $M_2$, a third transistor $M_3$, and a fourth transistor $M_4$. For example, the four transistors are all NMOS transistors. A drain of the fourth transistor $M_4$ is configured to receive a first voltage $V_{in0}$ and a first current $I_{in0}$. A source of the fourth transistor $M_4$ is electrically connected to a drain of the first transistor $M_1$. A source of the first transistor $M_1$ is grounded. A source of the third transistor $M_3$ is electrically connected to a drain of the second transistor $M_2$. A source of the second transistor $M_2$ is grounded. A gate of the third transistor $M_3$ which is electrically connected to a gate of the fourth transistor $M_4$, is configured to receive a bias voltage $V_{bias0}$. A gate of the second transistor $M_2$ is electrically connected to a gate of the first transistor $M_1$. The drain of the fourth transistor $M_4$ is electrically connected to the gate of the first transistor $M_1$. In the constant current circuit, the second transistor $M_2$ and the third transistor $M_3$ serve as mirror circuits of the first transistor $M_1$ and the fourth transistor $M_4$, and a mirrored second voltage $V_{out0}$ and a mirrored second current $I_{out0}$ are generated at the drain of the third transistor $M_3$. The second current $I_{out0}$ is output through the third transistor $M_3$ and the second transistor $M_2$. For example, The second current $I_{out0}$ is output to the dual-gate transistor according to some embodiments of the present disclosure.

In this embodiment, the constant current circuit is a constant current circuit with a cascode architecture. Such constant current circuit has a relatively large output impedance, so that in the above piezoelectric detection circuit, the impedance $r_O$ is mainly determined by the output impedance of the dual-gate transistor. Therefore, the impedance $r_O$ is hardly affected by the internal resistance of the constant current circuit. This makes it possible to more accurately detect the magnitude of the pressure using the amplitude of the output second voltage signal.

It should be noted that, FIG. 4 shows a constant current circuit formed of four NMOS transistors. However, it will be understood by those skilled in the art that a constant current circuit may be also formed by four PMOS transistors. For example, the four NMOS transistors in FIG. 4 may be replaced by four PMOS transistors, and the ground terminal may be replaced by a power supply voltage terminal, so as to form a constant current circuit according to other embodiments.

It should also be noted that FIG. 4 shows a constant current circuit with a cascode architecture consisting of four transistors. However, those skilled in the art will appreciate that the constant current circuit of the cascode architecture may be composed of other amounts of transistors. For example, the constant current circuit of the cascode architecture may be composed of two, six or more transistors. Therefore, the scope according to some embodiments of the present disclosure is not only limited to the structure of the constant current circuit shown in FIG. 4.

Figure 5:
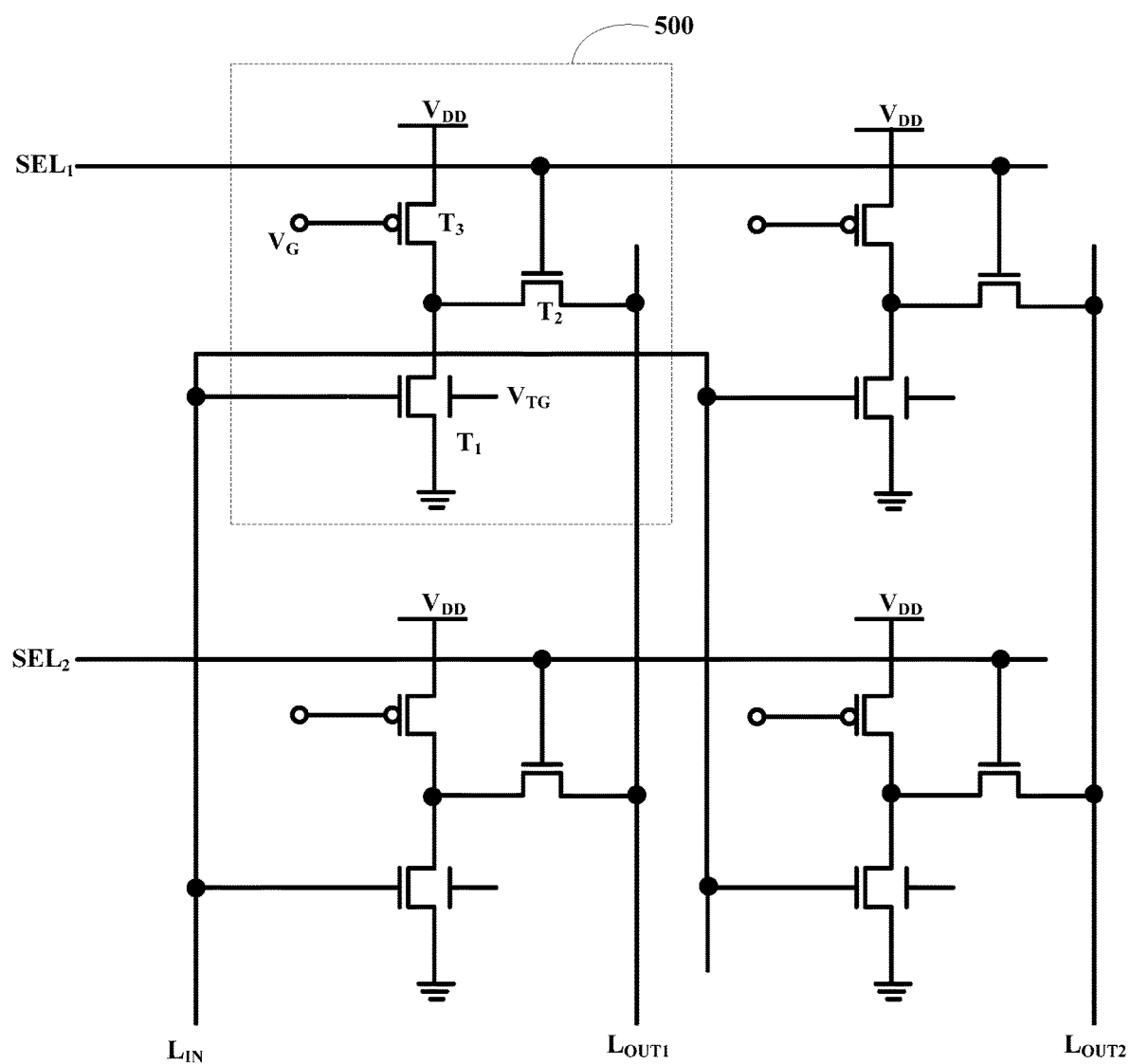
FIG. 5 is a circuit connection diagram showing a piezoelectric detection circuit array according to some embodiments of the present disclosure.

FIG. 5 is a circuit connection diagram showing a piezoelectric detection circuit array according to some embodiments of the present disclosure.

As shown in FIG. 5, the piezoelectric detection circuit array comprises a plurality of piezoelectric detection circuits 500. For example, the piezoelectric detection circuit 500 is a piezoelectric detection circuit as shown in FIG. 2A or 3. The piezoelectric detection circuit 500 comprises a constant current circuit, a dual-gate transistor $T_1$, and an output circuit. In some embodiments, the transmission circuit of each piezoelectric detection circuit 500 comprises a switch transistor $T_2$. In each piezoelectric detection circuit 500, a first electrode of the switch transistor $T_2$ is electrically connected to a second electrode of the dual-gate transistor $T_1$.

In some embodiments, the array comprises n×m (i.e., n rows×m columns) piezoelectric detection circuits, wherein n and m are both positive integers. Here, FIG. 5 shows a 2×2 piezoelectric detection circuit array. However, those skilled in the art should understand that the piezoelectric detection circuit array shown in FIG. 5 is merely exemplary, and the scope according to some embodiments of the present disclosure is not limited thereto. For example, the piezoelectric detection circuit array may also be 2×4, 8×8, 16×32, and so on array.

In some embodiments, as shown in FIG. 5, the piezoelectric detection circuit array further comprises an input signal line $L_{IN}$. The input signal line $L_{IN}$ is electrically connected to the first gate of the dual-gate transistor $T_1$ in each of the plurality of piezoelectric detection circuits. The input signal line $L_{IN}$ is configured to provide the first voltage signal to the plurality of piezoelectric detection circuits.

In some embodiments, as shown in FIG. 5, the piezoelectric detection circuit array further comprises a plurality of gating signal lines. For example, there are a first gating signal line $SEL_1$ and a second gating signal line $SEL_2$. For the n×m piezoelectric detection circuit array, there are n gating signal lines $SEL_1$~$SEL_n$. Each of the gating signal lines is electrically connected to the gate of the switch transistor $T_2$ in each of the piezoelectric detection circuits in the same row. Each of the gating signal lines is configured to provide a gating signal to the piezoelectric detection circuits in the same row so that the switch transistors $T_2$ in the row turn on.

In some embodiments, as shown in FIG. 5, the piezoelectric detection circuit array further comprises a plurality of output signal lines. For example, there are a first output signal line $L_{OUT1}$ and a second output signal line $L_{OUT2}$. For the n×m piezoelectric detection circuit array, there are m output signal lines $L_{OUT1}$~$L_{OUTm}$. Each of the output signal lines is electrically connected to the second electrode of the switch transistor $T_2$ in each of the piezoelectric detection circuits in the same column. Each of the output signal line is configured to output the second voltage signal from the switch transistor of a gated piezoelectric detection circuit. For example, the magnitude of the pressure applied to the dual-gate transistor of the piezoelectric detection circuit is obtained by detecting the amplitude of the second voltage signal output from the piezoelectric detection circuit in the first row and first column.

In the above-described embodiments of the present disclosure, the magnitude of the pressure applied to the dual-gate transistor of the piezoelectric detection circuit is obtained by detecting the amplitude of the second voltage signal output from the corresponding piezoelectric detection circuit of the above-described array. The circuit which is relatively simple, is easy to implement, and has a comparatively favorable anti-noise performance.

Figure 6:
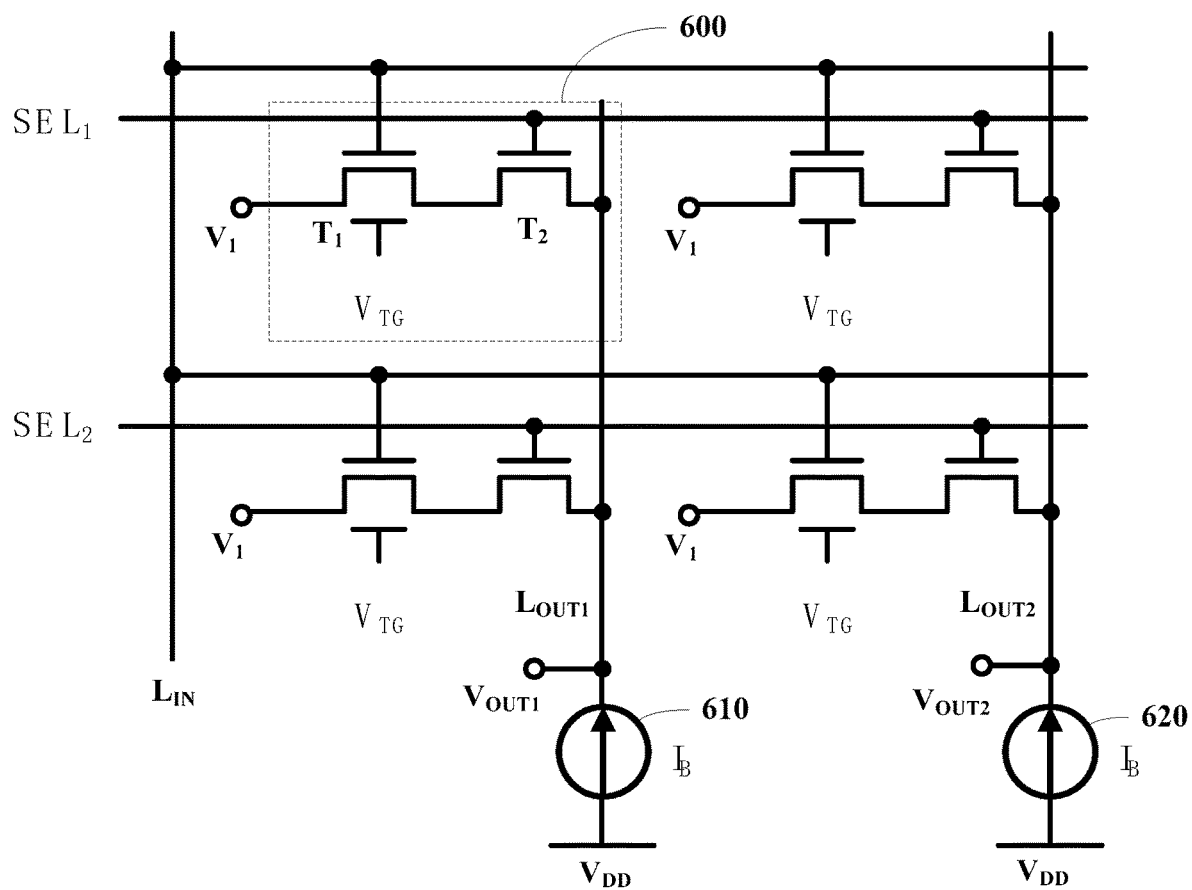
FIG. 6 is a circuit connection diagram showing a piezoelectric detection circuit array according to other embodiments of the present disclosure.

FIG. 6 is a circuit connection diagram showing a piezoelectric detection circuit array according to other embodiments of the present disclosure.

As shown in FIG. 6, the piezoelectric detection circuit array comprises a plurality of piezoelectric detection circuits 600. For example, the array comprises n×m piezoelectric detection circuits 600, wherein n and m are both positive integer. For example, FIG. 6 shows a 2×2 piezoelectric detection circuit array. Each of piezoelectric detection circuits 600 comprises a dual-gate transistor $T_1$ and a switch transistor $T_2$. A second gate of the dual-gate transistor $T_1$ is configured to receive a bias voltage $V_{TG}$ and a pressure. A first electrode of the dual-gate transistor $T_1$ is electrically connected to a first voltage terminal $V_1$ (for example, the ground terminal). A second electrode of the dual-gate transistor $T_1$ is electrically connected to a first electrode of the switch transistor $T_2$.

As shown in FIG. 6, the piezoelectric detection circuit array further comprises an input signal line $L_{IN}$. The input signal line $L_{IN}$ electrically connected to a first gate of the dual-gate transistor in each of the plurality of piezoelectric detection circuits. The input signal line $L_{IN}$ is configured to provide a first voltage signal to the plurality of piezoelectric detection circuits.

As shown in FIG. 6, the piezoelectric detection circuit array further comprises a plurality of constant current circuits. For example, there are a first constant current circuit 610 and a second constant current circuit 620. For the n×m piezoelectric detection circuit array, there are m constant current circuits. Each of the constant current circuits is configured to provide a constant current $I_B$ to piezoelectric detection circuits in the same column via an output signal line connected thereto. For example, the first constant current circuit 610 provides a constant current to the piezoelectric detection circuits in the first column via a first output signal line $L_{OUT1}$, and the second constant current circuit 620 provides a constant current to the piezoelectric detection circuits in the second column via a second output signal line $L_{OUT2}$.

As shown in FIG. 6, the piezoelectric detection circuit array further comprises a plurality of gating signal lines. For example, FIG. 6 shows that there are a first gating signal line $SEL_1$ and a second gating signal line $SEL_2$. For the n×m piezoelectric detection circuit array, there are n gating signal lines $SEL_1$~$SEL_n$. Each of the gating signal lines is electrically connected to a gate of the switch transistor $T_2$ in each of the piezoelectric detection circuits 600 in the same row. Each of the gating signal lines is configured to provide a gating signal to the piezoelectric detection circuits in the same row so that the switch transistors $T_2$ in the row turn on.

As shown in FIG. 6, the piezoelectric detection circuit array further comprises a plurality of output signal lines. For example, FIG. 6 shows that there are the first output signal line $L_{OUT1}$ and the second output signal line $L_{OUT2}$. For the n×m piezoelectric detection circuit array, there are m output signal lines $L_{OUT1}$~$L_{OUTm}$. Each of the output signal lines is electrically connected to a second electrode of the switch transistor $T_2$ in each of the piezoelectric detection circuits 600 in the same column. Each of the output signal lines is configured to output a second voltage signal from the switch transistor of a gated piezoelectric detection circuit. For example, the second voltage signal may be read out at a first read terminal $V_{OUT1}$ or a second read terminal $V_{OUT2}$. A magnitude of the pressure is obtained by detecting an amplitude of the second voltage signal.

In the piezoelectric detection circuit array of above-described embodiments, for each column of piezoelectric detection circuits, a constant current circuit is used to provide a constant current to the piezoelectric detection circuits in the respective column. When the piezoelectric detection circuits in a certain row is gated by the gating signal line, the input first voltage signal $V_{IN}$ is output to the corresponding output signal line after being processed (for example, amplified) by the corresponding dual-gate transistor, and the second voltage signal is read out by the corresponding read terminal (for example, $V_{OUT1}$ terminal or $V_{OUT2}$ terminal), thus, the magnitude of the pressure is obtained by detecting the amplitude of the second voltage signal.

In above-described embodiments, the constant current circuits are disposed outside the array. For example, the constant current circuits are fabricated on a display screen or an IC (Integrated Circuit) for facilitating the fabrication of above-described piezoelectric detection circuit array. Moreover, since the current source is provided externally, the current is less affected by other circuits or transistors, which makes the detection of the pressure more accurate. In addition, since the piezoelectric detection circuits in the same column share one constant current circuit, the total amount of constant current circuits in the array and the cost is reduced.

In some embodiments, the dual-gate transistor is an N-channel dual-gate transistor, and the first voltage signal is a sine wave signal.

In other embodiments, the dual-gate transistor is a P-channel dual-gate transistor, and the first voltage signal is a constant voltage signal.

In some embodiments, similar to that shown in FIG. 3, the constant current circuit shown in FIG. 6 comprises a second voltage terminal (e.g., a power supply voltage terminal $V_{DD}$) and a PMOS transistor. A first electrode (e.g., a source) of the PMOS transistor is electrically connected to the second voltage terminal. A second electrode (e.g., a drain) of the PMOS transistor is electrically connected to the output signal line. The PMOS transistor when turns on outputs a constant current to the piezoelectric detection circuits in the same column through the output signal line. Such constant current circuit may be implemented easily with more simple structure and lower cost.

In other embodiments, the constant current circuit shown in FIG. 6 is a constant current circuit with a cascode architecture. The magnitude of the pressure may be more accurately detected by using a constant current circuit with a cascode architecture in the piezoelectric detection circuit array described above.

In some embodiments of the present disclosure, a pressure detection device is also provided. The pressure detection device comprises the piezoelectric detection circuit as described above, such as the piezoelectric detection circuit shown in FIG. 2A or 3.

In other embodiments of the present disclosure, a pressure detection device is also provided. The pressure detection device comprises the piezoelectric detection circuit array as described above, such as the piezoelectric detection circuit array shown in FIG. 5 or 6.

In some embodiments, the pressure detection device is a touch panel or the like.

Figure 7:
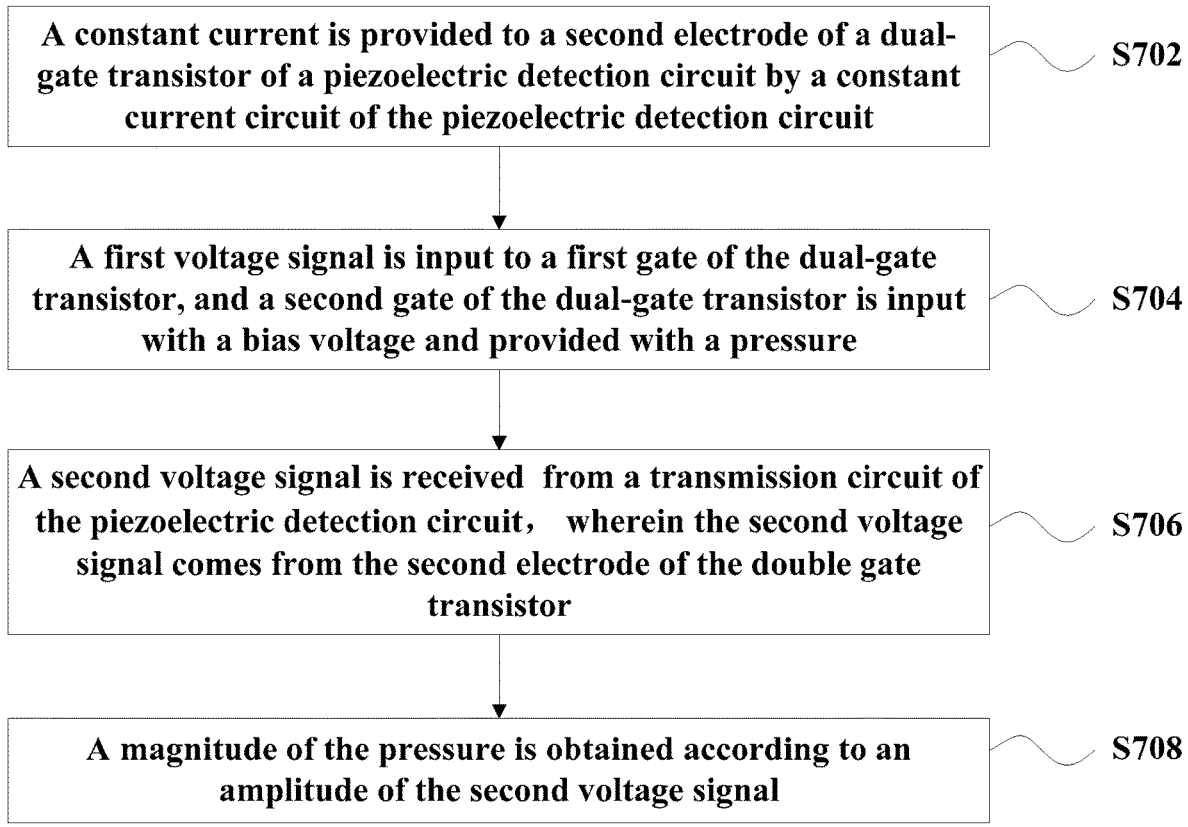
FIG. 7 is a flow chart showing a method of detecting a pressure by a piezoelectric detection circuit according to some embodiments of the present disclosure.

FIG. 7 is a flow chart showing a method of detecting a pressure by a piezoelectric detection circuit according to some embodiments of the present disclosure.

In step S702, a constant current is provided to a second electrode of a dual-gate transistor of a piezoelectric detection circuit by a constant current circuit of the piezoelectric detection circuit. A first electrode of the dual-gate transistor is electrically connected to a first voltage terminal.

In step S704, a first voltage signal is input to a first gate of the dual-gate transistor, and a second gate of the dual-gate transistor is input with a bias voltage and provided with a pressure.

In step S706, a second voltage signal is received from a transmission circuit of the piezoelectric detection circuit, wherein the second voltage signal comes from the second electrode of the dual-gate transistor. For example, the transmission circuit comprises a switch transistor. The second voltage signal from the second electrode of the dual-gate transistor is received via a second electrode of the switch transistor.

In step S708, the magnitude of the pressure is obtained according to an amplitude of the second voltage signal.

In some embodiments, the step S708 is implemented by obtaining the magnitude of the pressure according to the amplitude of the second voltage signal and a corresponding relation between the pressure and the amplitude of the second voltage signal. For example, the corresponding relation between the pressure and the amplitude of the second voltage signal is a corresponding relation of positive correlation.

In other embodiments, a corresponding relation list between the pressure and the amplitude of the second voltage signal is obtained in advance, and then the magnitude of the corresponding pressure is obtained by retrieving the corresponding relation list based on the amplitude of the output second voltage signal.

In the method of above-described embodiments, a constant current is provided to the second electrode of the dual-gate transistor of the piezoelectric detection circuit by the constant current circuit of the piezoelectric detection circuit. The first voltage signal is input to the first gate of the dual-gate transistor of the piezoelectric detection circuit, and the second gate of the dual-gate transistor is input with a bias voltage and is provided with a pressure. The second voltage signal from the second electrode of the dual-gate transistor is received from the transmission circuit of the piezoelectric detection circuit. The magnitude of the pressure is obtained according to the amplitude of the second voltage signal. By such a method, the detection of the magnitude of the pressure applied to the second gate of the dual-gate transistor is achieved. The structure of the circuit used for implementing the method is relatively simple and is implemented easily with a comparatively favorable anti-noise performance.

Figure 8:
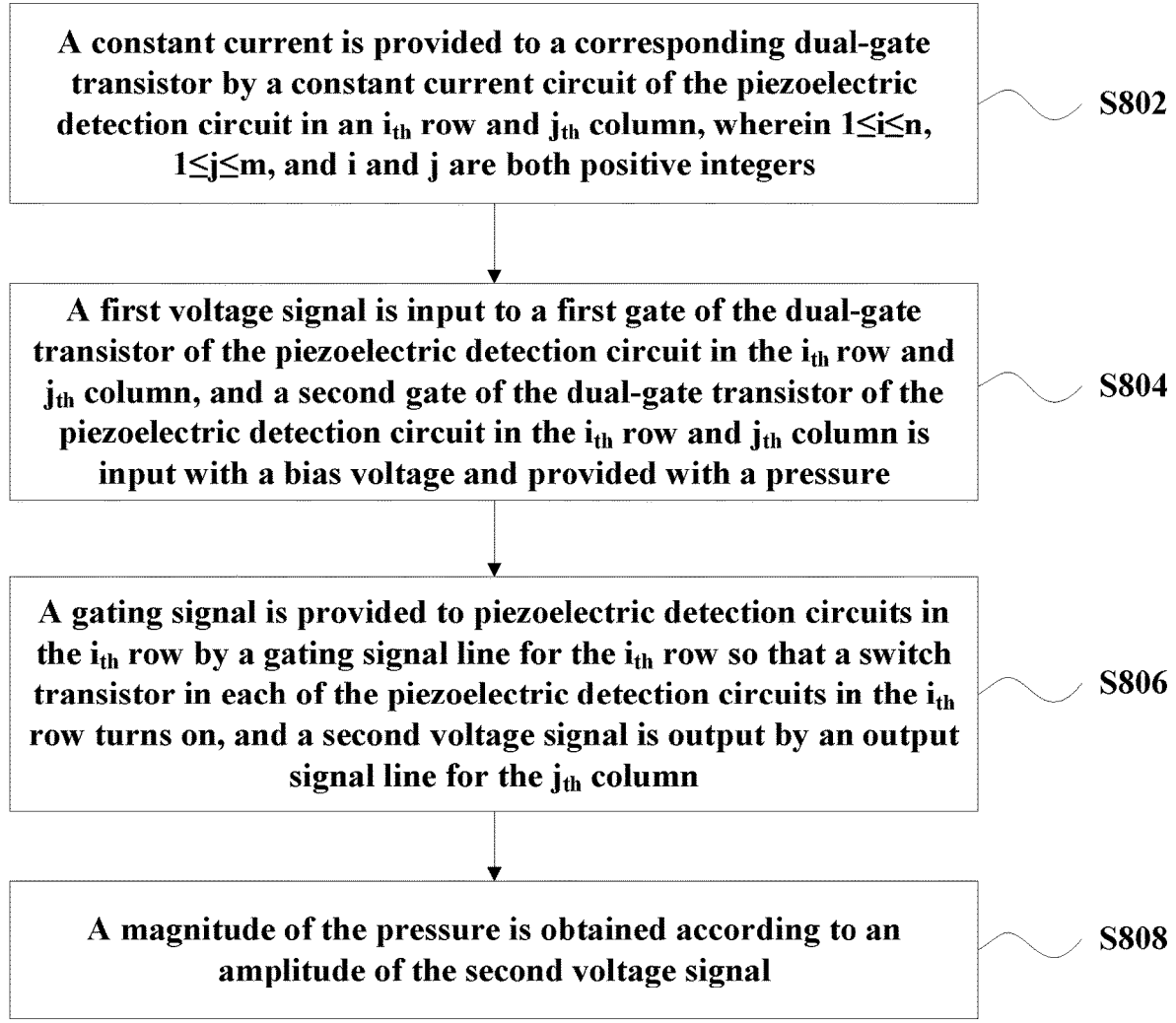
FIG. 8 is a flow chart showing a method of detecting a pressure by a piezoelectric detection circuit array according to some embodiments of the present disclosure.

FIG. 8 is a flow chart showing a method of detecting a pressure by a piezoelectric detection circuit array according to some embodiments of the present disclosure. The piezoelectric detection circuit array comprises n×m piezoelectric detection circuits, wherein n and m are both positive integer. The pressure is detected, for example, by the piezoelectric detection circuit array as shown in FIG. 5.

In step S802, a constant current is provided to a corresponding dual-gate transistor by a constant current circuit of the piezoelectric detection circuit in an $i_{th}$ row and $j_{th}$ column, wherein 1≤i≤n, 1≤j≤m, and i and j are both positive integers.

In step S804, a first voltage signal is input to a first gate of the dual-gate transistor of the piezoelectric detection circuit in the $i_{th}$ row and $j_{th}$ column, and a second gate of the dual-gate transistor of the piezoelectric detection circuit in the $i_{th}$ row and $j_{th}$ column is input with a bias voltage and provided with a pressure.

In step S806, a gating signal is provided to piezoelectric detection circuits in the $i_{th}$ row by a gating signal line for the $i_{th}$ row so that a switch transistor in each of the piezoelectric detection circuits in the $i_{th}$ row turns on, and a second voltage signal is output by an output signal line for the $j_{th}$ column. That is, the output signal line for the $j_{th}$ column is used to output the second voltage signal from the piezoelectric detection circuit in the $i_{th}$ row and $j_{th}$ column.

In step S808, A magnitude of the pressure is obtained according to an amplitude of the second voltage signal. That is, the magnitude of the pressure applied to the piezoelectric detection circuit in the $i_{th}$ row and $j_{th}$ column is obtained according to the amplitude of the second voltage signal.

In some embodiments, the step S808 is implemented by obtaining the magnitude of the pressure according to the amplitude of the second voltage signal and a corresponding relation between the pressure and the amplitude of the second voltage signal.

In above-described embodiments, a method for detecting a pressure by a piezoelectric detection circuit array according to some embodiments of the present disclosure is provided. The detection of the magnitude of the pressure applied to the second gates of the dual-gate transistors of the array is realized by detecting the pressure using certain piezoelectric detection circuit(s) of the array. The structure of the circuit for implementing the method is more relatively simple and is implemented easily with a comparatively favorable anti-noise performance.

Figure 9:
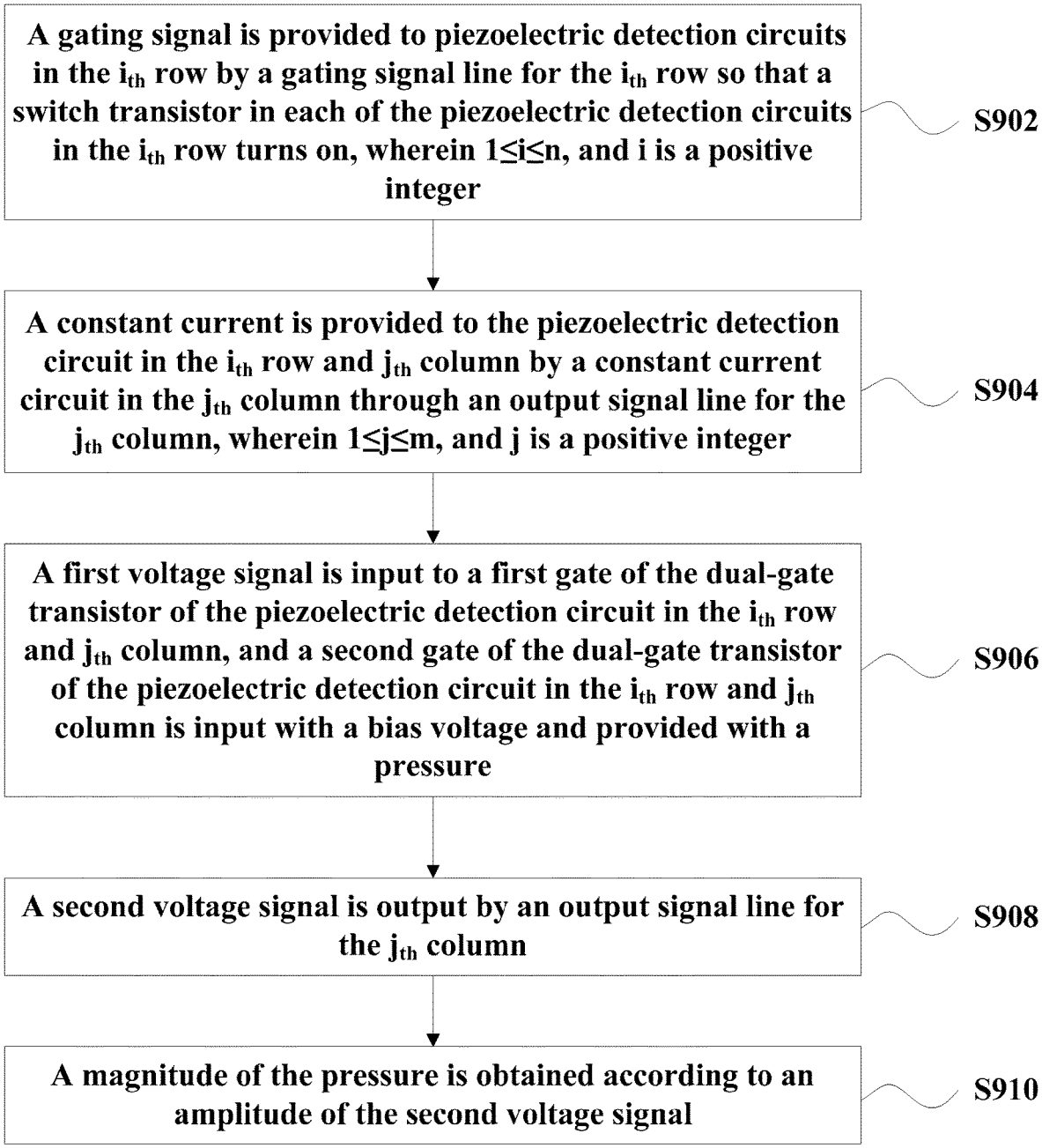
FIG. 9 is a flow chart showing a method of detecting a pressure by a piezoelectric detection circuit array according to other embodiments of the present disclosure.

FIG. 9 is a flow chart showing a method of detecting a pressure by a piezoelectric detection circuit array according to other embodiments of the present disclosure. The piezoelectric detection circuit array comprises n×m piezoelectric detection circuits, wherein n and m are both positive integer. The pressure is detected, for example, by the piezoelectric detection circuit array as shown in FIG. 6.

In step S902, a gating signal is provided to piezoelectric detection circuits in the $i_{th}$ row by a gating signal line for the $i_{th}$ row so that a switch transistor in each of the piezoelectric detection circuits in the $i_{th}$ row turns on, wherein 1≤i≤n, and i is a positive integer.

In step S904, a constant current is provided to the piezoelectric detection circuit in the $i_{th}$ row and $j_{th}$ column by a constant current circuit in the $j_{th}$ column through an output signal line for the $j_{th}$ column, wherein 1≤j≤m, and j is a positive integer.

In step S906, a first voltage signal is input to a first gate of the dual-gate transistor of the piezoelectric detection circuit in the $i_{th}$ row and $j_{th}$ column, and a second gate of the dual-gate transistor of the piezoelectric detection circuit in the $i_{th}$ row and $j_{th}$ column is input with a bias voltage and provided with a pressure.

In step S908, a second voltage signal is output by an output signal line for the $j_{th}$ column. That is, the output signal line for the $j_{th}$ column is used to output the second voltage signal from the piezoelectric detection circuit in the $i_{th}$ row and $j_{th}$ column.

In step S910, A magnitude of the pressure is obtained according to an amplitude of the second voltage signal. That is, the magnitude of the pressure applied to the piezoelectric detection circuit in the $i_{th}$ row and $j_{th}$ column is obtained according to the amplitude of the second voltage signal.

In some embodiments, the step S910 is implemented by obtaining the magnitude of the pressure according to the amplitude of the second voltage signal and a corresponding relation between the pressure and the amplitude of the second voltage signal.

In above-described embodiments, a method for detecting a pressure by a piezoelectric detection circuit array according to other embodiments of the present disclosure is provided. The detection of the magnitude of the pressure applied to the second gates of the dual-gate transistors of the array is realized by detecting the pressure using certain piezoelectric detection circuit(s) of the array. The structure of the circuit for implementing the method is more relatively simple and is implemented easily with a comparatively favorable anti-noise performance.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A piezoelectric detection circuit, comprising:
   a dual-gate transistor, wherein a first gate of the dual-gate transistor is configured to receive a first voltage signal, a second gate of the dual-gate transistor is configured to receive a bias voltage and a pressure, a first electrode of the dual-gate transistor is electrically connected to a first voltage terminal, and a second electrode of the dual-gate transistor is configured to receive a constant current;
   a constant current circuit configured to provide the constant current to the dual-gate transistor; and
   a transmission circuit configured to output a second voltage signal from the second electrode, wherein a magnitude of the pressure is obtained according to an amplitude of the second voltage signal.

2. The piezoelectric detection circuit according to claim 1, wherein the transmission circuit comprises:
   a switch transistor, wherein a gate of the switch transistor is configured to receive a gating signal, a first electrode of the switch transistor is electrically connected to the second electrode of the dual-gate transistor, and a second electrode of the switch transistor is configured to output the second voltage signal in the case that the switch transistor turns on.

3. The piezoelectric detection circuit according to claim 2, wherein
   an output terminal of the constant current circuit is electrically connected to the second electrode of the switch transistor.

4. The piezoelectric detection circuit according to claim 1, wherein
   an output terminal of the constant current circuit is electrically connected to the second electrode of the dual-gate transistor.

5. The piezoelectric detection circuit according to claim 1, wherein
   the constant current circuit comprises a second voltage terminal and a PMOS transistor,
   wherein a first electrode of the PMOS transistor is electrically connected to the second voltage terminal, and a second electrode of the PMOS transistor is electrically connected to the second electrode of the dual-gate transistor.

6. The piezoelectric detection circuit according to claim 5, wherein
   the first voltage terminal is a ground terminal, and the second voltage terminal is a power supply voltage terminal.

7. The piezoelectric detection circuit according to claim 1, wherein
   the magnitude of the pressure is obtained according to the amplitude of the second voltage signal and a corresponding relation between the pressure and the amplitude of the second voltage signal.

8. The piezoelectric detection circuit according to claim 7, wherein
   The pressure is positively related to the amplitude of the second voltage signal.

9. A piezoelectric detection circuit array, comprising: a plurality of piezoelectric detection circuits according to claim 1.

10. The piezoelectric detection circuit array according to claim 9, wherein
    the transmission circuit of each of the piezoelectric detection circuits comprises a switch transistor, wherein in each of the piezoelectric detection circuits, a first electrode of the switch transistor is electrically connected to the second electrode of the dual-gate transistor;
    the piezoelectric detection circuit array further comprises:
    an input signal line electrically connected to the first gate of the dual-gate transistor in each of the plurality of piezoelectric detection circuits, and configured to provide the first voltage signal to the plurality of piezoelectric detection circuits;
    a plurality of gating signal lines, each of which is electrically connected to a gate of the switch transistor in each of the piezoelectric detection circuits in the same row, and is configured to provide a gating signal to the piezoelectric detection circuits in the same row; and
    a plurality of output signal lines, each of which is electrically connected to a second electrode of the switch transistor in each of the piezoelectric detection circuits in the same column, and is configured to output the second voltage signal from the switch transistor of a gated piezoelectric detection circuit.

11. A pressure detection device, comprising: the piezoelectric detection circuit array according to claim 10.

12. The piezoelectric detection circuit array according to claim 10, wherein
    the piezoelectric detection circuits in the same column share one constant current circuit, and the one constant current circuit is configured to provide a constant current to the piezoelectric detection circuits in the same column via an output signal line connected thereto.

13. A pressure detection device, comprising: the piezoelectric detection circuit array according to claim 12.

14. A pressure detection device, comprising: the piezoelectric detection circuit according to claim 1.

15. A method of detecting a pressure by a piezoelectric detection circuit, comprising:
    providing a constant current to a second electrode of a dual-gate transistor of a piezoelectric detection circuit by a constant current circuit of the piezoelectric detection circuit, wherein a first electrode of the dual-gate transistor is electrically connected to a first voltage terminal;
    inputting a first voltage signal to a first gate of the dual-gate transistor, and inputting a bias voltage and providing a pressure to a second gate of the dual-gate transistor;
    receiving a second voltage signal from a transmission circuit of the piezoelectric detection circuit, wherein the second voltage signal comes from the second electrode; and
    obtaining a magnitude of the pressure according to an amplitude of the second voltage signal.

16. The method according to claim 15, wherein the step of obtaining the magnitude of the pressure according to an amplitude of the second voltage signal comprises:
    obtaining the magnitude of the pressure according to the amplitude of the second voltage signal and a corresponding relation between the pressure and the amplitude of the second voltage signal.

17. A method of detecting a pressure by the piezoelectric detection circuit array, wherein the piezoelectric detection circuit array comprises n×m piezoelectric detection circuits, in which n and m are both positive integers,
    each of the n×m piezoelectric detection circuits comprising: a dual-gate transistor, wherein a first gate of the dual-gate transistor is configured to receive a first voltage signal, a second gate of the dual-gate transistor is configured to receive a bias voltage and a pressure, a first electrode of the dual-gate transistor is electrically connected to a first voltage terminal, and a second electrode of the dual-gate transistor is configured to receive a constant current; a constant current circuit configured to provide the constant current to the dual-gate transistor; and a transmission circuit configured to output a second voltage signal from the second electrode, wherein a magnitude of the pressure is obtained according to an amplitude of the second voltage signal;
    the transmission circuit of each of the n×m piezoelectric detection circuits comprising a switch transistor, wherein in each of the piezoelectric detection circuits, a first electrode of the switch transistor is electrically connected to the second electrode of the dual-gate transistor;
    the piezoelectric detection circuit array further comprising: an input signal line electrically connected to the first gate of the dual-gate transistor in each of the plurality of piezoelectric detection circuits, and configured to provide the first voltage signal to the plurality of piezoelectric detection circuits; a plurality of gating signal lines, each of which is electrically connected to a gate of the switch transistor in each of the piezoelectric detection circuits in the same row, and is configured to provide a gating signal to the piezoelectric detection circuits in the same row; and a plurality of output signal lines, each of which is electrically connected to a second electrode of the switch transistor in each of the piezoelectric detection circuits in the same column, and is configured to output the second voltage signal from the switch transistor of a gated piezoelectric detection circuit; and
    the method comprising:
    providing a constant current to a corresponding dual-gate transistor by a constant current circuit in the piezoelectric detection circuit in an $i_{th}$ row and $j_{th}$ column, wherein 1≤i≤n, 1≤j≤m, and i and j are both positive integers;
    inputting a first voltage signal to a first gate of the dual-gate transistor of the piezoelectric detection circuit in the $i_{th}$ row and $j_{th}$ column, and inputting a bias voltage and providing a pressure to a second gate of the dual-gate transistor of the piezoelectric detection circuit in the $i_{th}$ row and $j_{th}$ column;
    providing a gating signal to piezoelectric detection circuits in the $i_{th}$ row by a gating signal line for the $i_{th}$ row so that a switch transistor of each of the piezoelectric detection circuits in the $i_{th}$ row turns on, and outputting a second voltage signal by an output signal line for the $j_{th}$ column; and
    obtaining a magnitude of the pressure according to an amplitude of the second voltage signal.

18. The method according to claim 17, wherein the step of obtaining the magnitude of the pressure according to an amplitude of the second voltage signal comprises:
    obtaining the magnitude of the pressure according to the amplitude of the second voltage signal and a corresponding relation between the pressure and the amplitude of the second voltage signal.

* * * * *